(12) United States Patent
Hsu et al.

(10) Patent No.: US 11,742,412 B2
(45) Date of Patent: Aug. 29, 2023

(54) METHOD FOR FABRICATING A METAL GATE TRANSISTOR WITH A STACKED DOUBLE SIDEWALL SPACER STRUCTURE

(71) Applicant: UNITED MICROELECTRONICS CORP., Hsin-Chu (TW)

(72) Inventors: Te-Chang Hsu, Tainan (TW); Chun-Chia Chen, Tainan (TW); Yao-Jhan Wang, Tainan (TW); Chun-Jen Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 197 days.

(21) Appl. No.: 16/985,242

(22) Filed: Aug. 5, 2020

(65) Prior Publication Data

US 2020/0365710 A1 Nov. 19, 2020

Related U.S. Application Data

(62) Division of application No. 15/710,820, filed on Sep. 20, 2017, now Pat. No. 10,777,657.

(30) Foreign Application Priority Data

Aug. 21, 2017 (TW) .................................. 106128223

(51) Int. Cl.
*H01L 29/66* (2006.01)
*H01L 29/78* (2006.01)
*H01L 29/49* (2006.01)
*H01L 21/768* (2006.01)
*H01L 21/28* (2006.01)
(Continued)

(52) U.S. Cl.
CPC .... *H01L 29/6656* (2013.01); *H01L 21/28247* (2013.01); *H01L 21/76829* (2013.01); *H01L 21/76832* (2013.01); *H01L 21/76834* (2013.01); *H01L 21/823821* (2013.01); *H01L 29/4958* (2013.01); *H01L 29/4966* (2013.01); *H01L 29/4983* (2013.01); *H01L 29/6653* (2013.01); *H01L 29/66545* (2013.01); *H01L 29/66795* (2013.01); *H01L 29/7851* (2013.01); *H01L 29/0847* (2013.01); *H01L 29/161* (2013.01); *H01L 29/1608* (2013.01); *H01L 29/24* (2013.01); *H01L 29/7848* (2013.01)

(58) Field of Classification Search
CPC ............. H01L 29/4958; H01L 29/4966; H01L 29/4983; H01L 29/6653; H01L 29/66545; H01L 29/6656; H01L 21/28247; H01L 21/76834

See application file for complete search history.

(56) References Cited

U.S. PATENT DOCUMENTS 6,194,302 B1 2/2001 Shen
6,420,250 B1 * 7/2002 Cho ................ H01L 21/823468
257/E21.507

(Continued)

*Primary Examiner* — Marcos D. Pizarro
(74) *Attorney, Agent, or Firm* — Winston Hsu

(57) ABSTRACT

A method for fabricating semiconductor device includes the steps of: forming a gate structure on a substrate; forming a spacer around the gate structure; forming a first contact etch stop layer (CESL) around the spacer; forming a mask layer on the first CESL; removing part of the mask layer; removing part of the first CESL; forming a second CESL on the mask layer and the gate structure; and removing part of the second CESL.

1 Claim, 4 Drawing Sheets

(51) Int. Cl.
*H01L 21/8238* (2006.01)
*H01L 29/08* (2006.01)
*H01L 29/16* (2006.01)
*H01L 29/24* (2006.01)
*H01L 29/161* (2006.01)

(56) References Cited

U.S. PATENT DOCUMENTS

| | | |
|---|---|---|
| 9,349,833 B1 * | 5/2016 | Hung .................. H01L 29/6653 |
| 9,583,628 B2 | 2/2017 | Cheng et al. |
| 2005/0263825 A1 | 12/2005 | Frohberg |
| 2008/0237726 A1 * | 10/2008 | Dyer ............... H01L 21/823864 |
| | | 257/E27.06 |
| 2011/0241085 A1 | 10/2011 | O'Meara |
| 2013/0078791 A1 | 3/2013 | Xie |
| 2013/0178053 A1 | 7/2013 | Li |
| 2013/0270613 A1 * | 10/2013 | Chou .................. H01L 29/6653 |
| | | 257/288 |
| 2015/0380519 A1 | 12/2015 | Zhao |
| 2016/0043186 A1 | 2/2016 | Liu |
| 2017/0186692 A1 * | 6/2017 | Zhao .................. H01L 21/0214 |

* cited by examiner

METHOD FOR FABRICATING A METAL GATE TRANSISTOR WITH A STACKED DOUBLE SIDEWALL SPACER STRUCTURE

CROSS REFERENCE TO RELATED APPLICATIONS

This application is a division of U.S. application Ser. No. 15/710,820 filed Sep. 20, 2017, and incorporated herein by reference in its entirety.

BACKGROUND OF THE INVENTION

1. Field of the Invention

The invention relates to a method for fabricating semiconductor device, and more particularly, to a method for forming dual contact etch stop layers (CESLs) adjacent to the spacer.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

Typically, threshold voltage in conventional planar metal gate transistors is adjusted by the means of ion implantation. With the trend in the industry being towards scaling down the size of the metal oxide semiconductor transistors (MOS), three-dimensional or non-planar transistor technology, such as fin field effect transistor technology (FinFET) has been developed to replace planar MOS transistors. Nevertheless, when electrical field applied onto a dielectric material exceeds a threshold value, a sudden increase in the electrical current passing through the dielectric material would easily induce a time-dependent dielectric breakdown (TDDB) issue. Hence, how to resolve this issue in today's FinFET architecture has become an important task in this field.

SUMMARY OF THE INVENTION

According to an embodiment of the present invention, a method for fabricating semiconductor device includes the steps of: forming a gate structure on a substrate; forming a spacer around the gate structure; forming a first contact etch stop layer (CESL) around the spacer; forming a mask layer on the first CESL; removing part of the mask layer; removing part of the first CESL; forming a second CESL on the mask layer and the gate structure; and removing part of the second CESL.

According to another aspect of the present invention, a semiconductor device includes: a gate structure on a substrate; a spacer around the gate structure; a first contact etch stop layer (CESL) around the spacer; and a second CESL around the spacer and on the first CESL.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
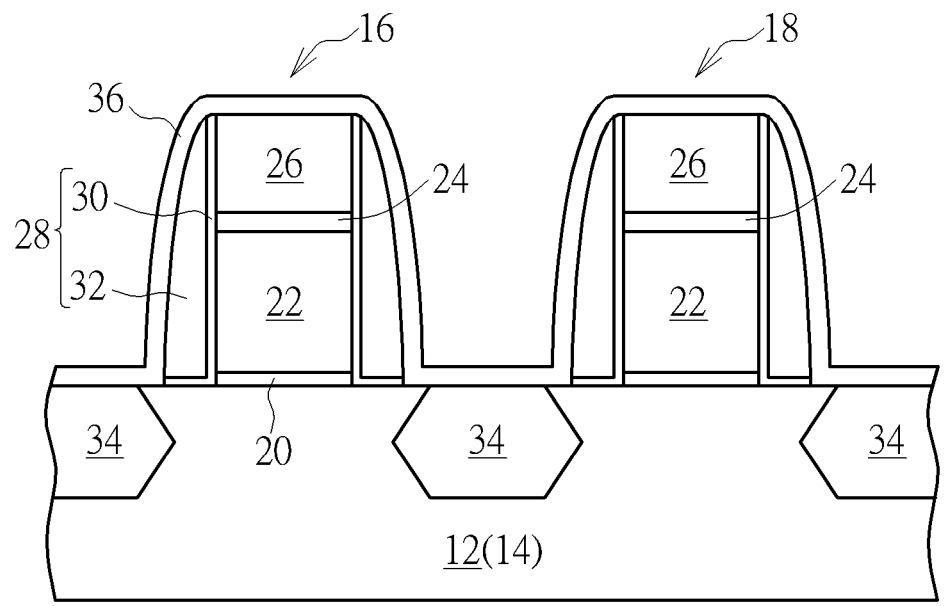
FIGS. 1-8 illustrate a method for fabricating a semiconductor device according to an embodiment of the present invention.

Referring to FIGS. 1-8, FIGS. 1-8 illustrate a method for fabricating a semiconductor device according to an embodiment of the present invention. As shown in FIG. 1, a substrate 12, such as a silicon substrate or silicon-on-insulator (SOI) substrate is first provided, and at least a transistor region such as a NMOS region or a PMOS region are defined on the substrate 12. Next, at least a fin-shaped structure 14 is formed on the substrate 12, in which the bottom of the fin-shaped structure 14 is surrounded by an insulating layer or shallow trench isolation (STI) made of material including but not limited to for example silicon oxide. It should be noted that even though this embodiment pertains to the fabrication of a non-planar FET device such as FinFET device, it would also be desirable to apply the following processes to a planar FET device, which is also within the scope of the present invention.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, at least a gate structures or dummy gate such as gate structures 16 and 18 are formed on the fin-shaped structure 14. In this embodiment, the formation of the gate structures 16 and 18 could be accomplished by a gate first process, a high-k first approach from gate last process, or a high-k last approach from gate last process. Since this embodiment pertains to a high-k last approach, a gate dielectric layer or interfacial layer, a gate material layer made of polysilicon, a first hard mask, and a second hard mask could be formed sequentially on the substrate 12, and a photo-etching process is then conducted by using a patterned resist (not shown) as mask to remove part of the second hard mask, part of the first hard mask, part of the gate material layer, and part of the gate dielectric layer through single or multiple etching processes. After stripping the patterned resist, gate structures 16 and 18 each composed of a patterned gate dielectric layer 20, a patterned material layer 22, a patterned first hard mask 24, and a patterned second hard mask 26 are formed on the fin-shaped structure 14.

In this embodiment, the first hard mask 24 and the second hard mask 26 are preferably made of different material, in which the first hard mask 24 preferably includes silicon nitride while the second hard mask 26 preferably includes silicon oxide, but not limited thereto. It should also be noted that even though two gate structures 16 and 18 are formed on the fin-shaped structure 14 in this embodiment, the quantity of the gate structures could also be adjusted depending on the demand of the product.

Next, at least a spacer 28 is formed on the sidewalls of the each of the gate structure 16 and 18, a source/drain region 34 and/or epitaxial layer (not shown) is formed in the fin-shaped structure 14 adjacent to two sides of the spacer 28, and selective silicide layers (not shown) could be formed on the surface of the source/drain regions 34. In this embodiment, the spacer 28 could be a single spacer or a composite spacer, such as a spacer including but not limited to for example an offset spacer 30 and a main spacer 32. Preferably, the offset spacer 30 and the main spacer 32 could include same material or different material while both the offset spacer 30 and the main spacer 32 could be made of material including but not limited to for example $SiO_2$, SiN, SiON, SiCN, or combination thereof. The source/drain region 34 could include dopants and epitaxial material of different conductive type depending on the type of device being fabricated. For example, the source/drain region 34 on NMOS region could include SiC or SiP while the source/drain region 34 on PMOS region could include SiGe, but not limited thereto.

Next, a first contact etch stop layer (CESL) 36 is formed on the surface of the fin-shaped structure 14 and the gate structure 16. In this embodiment, the first CESL is preferably made of low-k material including but not limited to for example SiOCN.

Figure 2:
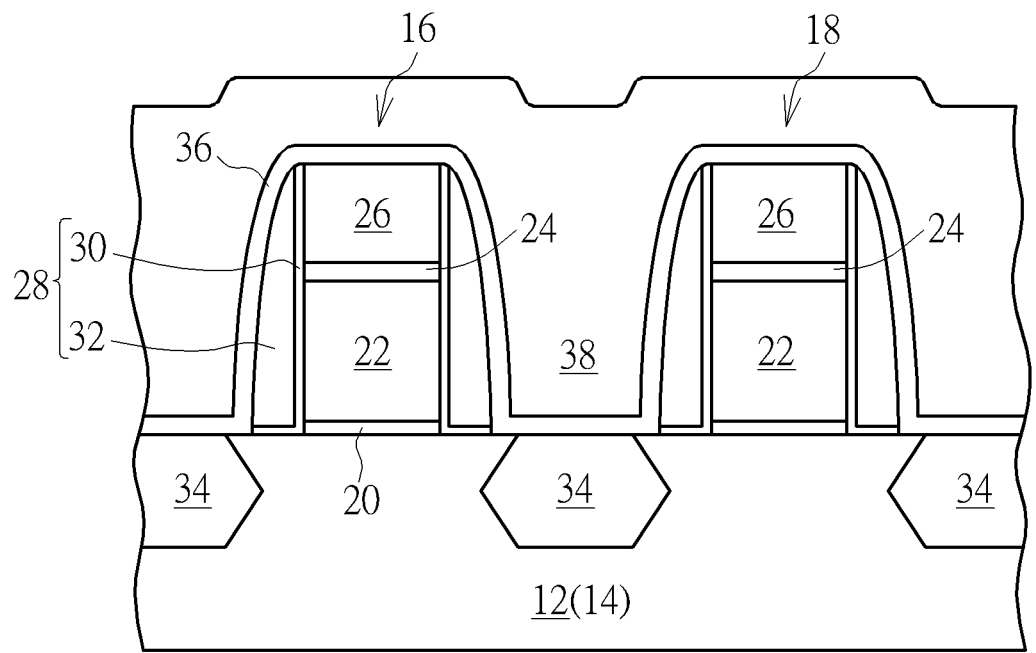

Next, as shown FIG. 2, a mask layer 38 is formed on the first CESL 36. Preferably, the mask layer 38 is made of dielectric material including but not limited to for example silicon oxide.

Figure 3:
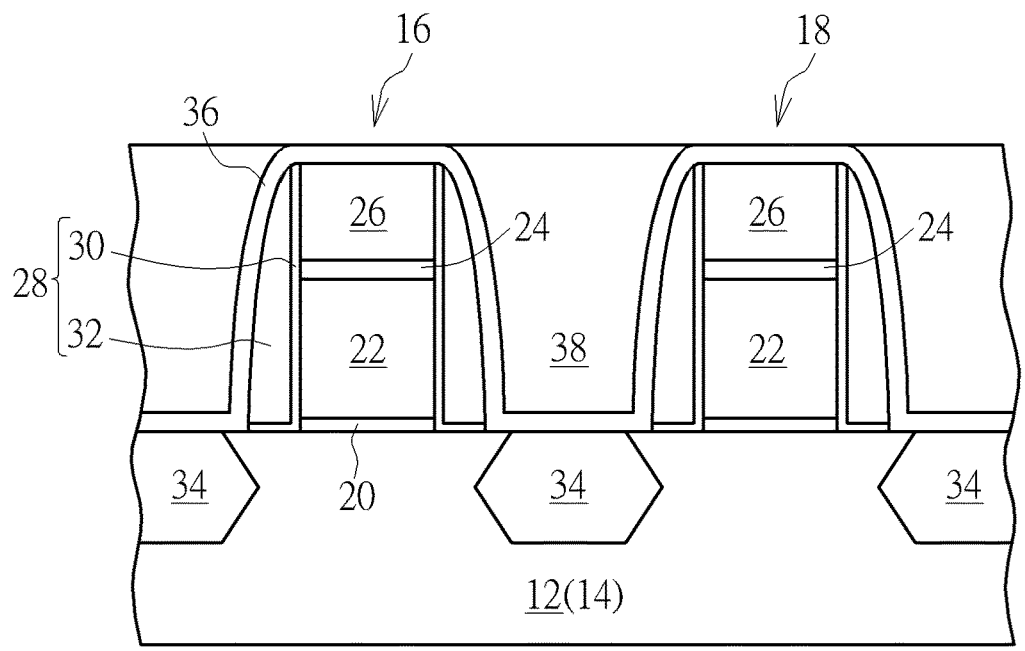

Next, as shown in FIG. 3, a planarizing process such as a chemical mechanical polishing (CMP) process is conducted to remove part of the mask layer 38 so that the top surface of the mask layer 38 is even with the top surface of the gate structures 16, 18 or the top surface of the first CESL 36.

Figure 4:
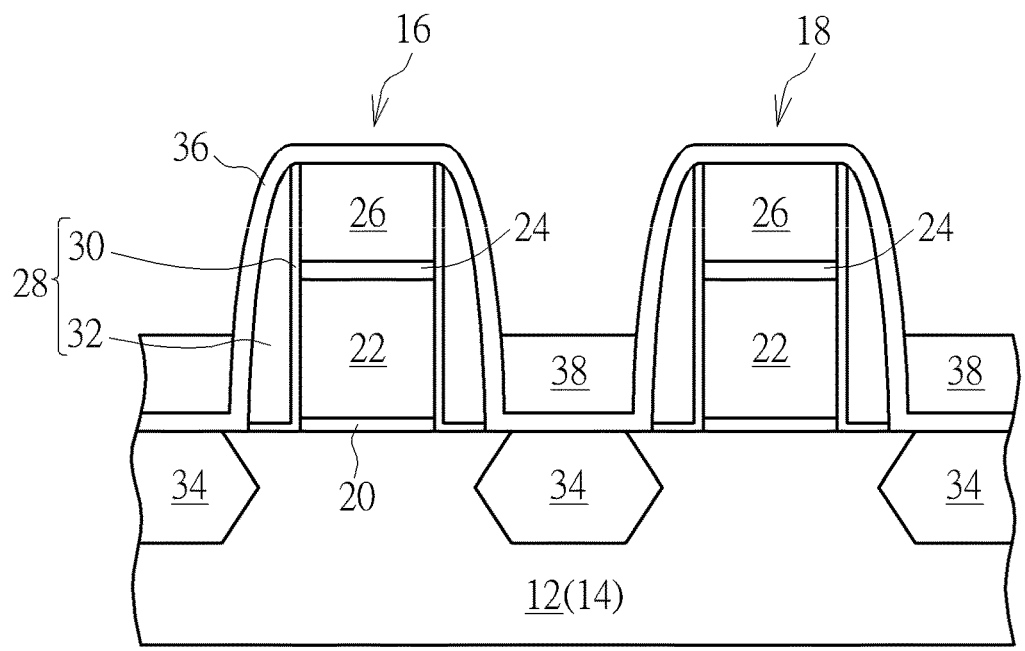

Next, as shown in FIG. 4, an etching process is conducted to remove part of the mask layer 38 so that the top surface of the mask layer 38 is lower than the top surface of the gate structures 16 and 18, or more specifically the top surface of the mask layer 38 is removed to be lower than the top surface of the gate material layer 22 or gate electrode in the gate structures 16, 18. In this embodiment, it would be desirable to use the selectivity between the mask layer 38 and the first CESL 36 to remove part of the mask layer 38 without forming any patterned mask, in which the etching process could be accomplished by the involvement of diluted hydrofluoric acid (dHF) or SiCoNi process. It is to be noted that the SiCoNi process is commonly conducted by reacting fluorine-containing gas with silicon oxide to form $((NH_4)_2SiF_6)$ thereby removing native oxide, in which the fluorine-containing gas could include HF or $NF_3$.

Figure 5:
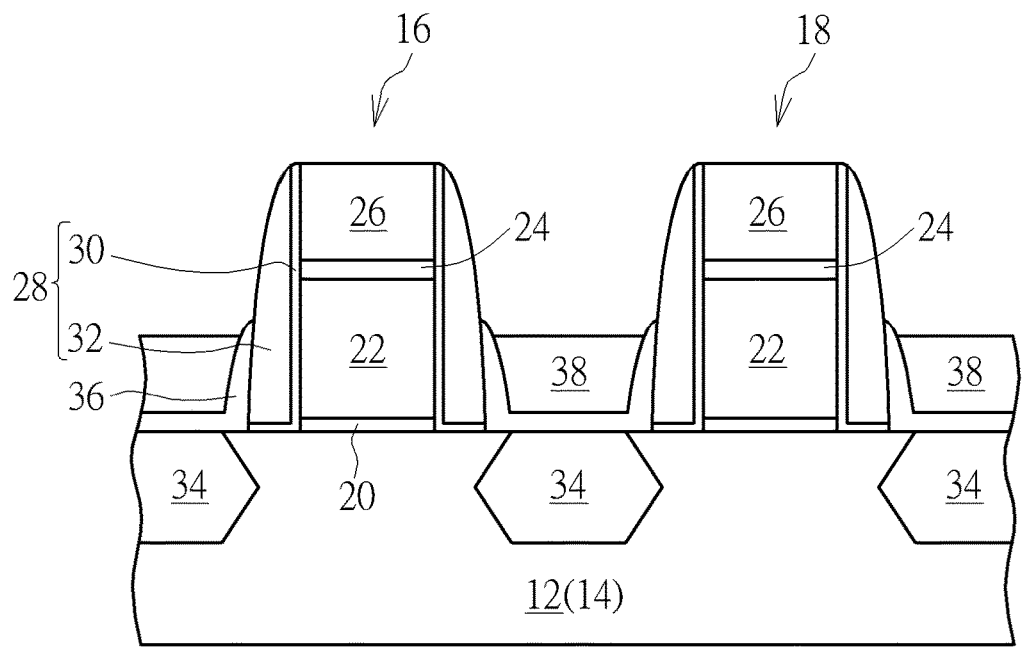

Next, as shown in FIG. 5, an etching process is conducted to remove part of the first CESL 36 so that the remaining portion of the first CESL 36 directly contacting the main spacer 32 becomes slightly spacer shaped and a top surface of the remaining first CESL 36 is slightly lower than the top surface of the gate material layer 22 of each of the gate structures 16, 18 and slightly higher than the top surface of the mask layer 38 as shown in FIG. 5 or even coplanar with the top surface of the mask layer 38. In this embodiment, the etching process used to remove part of the first CESL 36 could include gas such as but not limited to for example $CF_4$.

Figure 6:
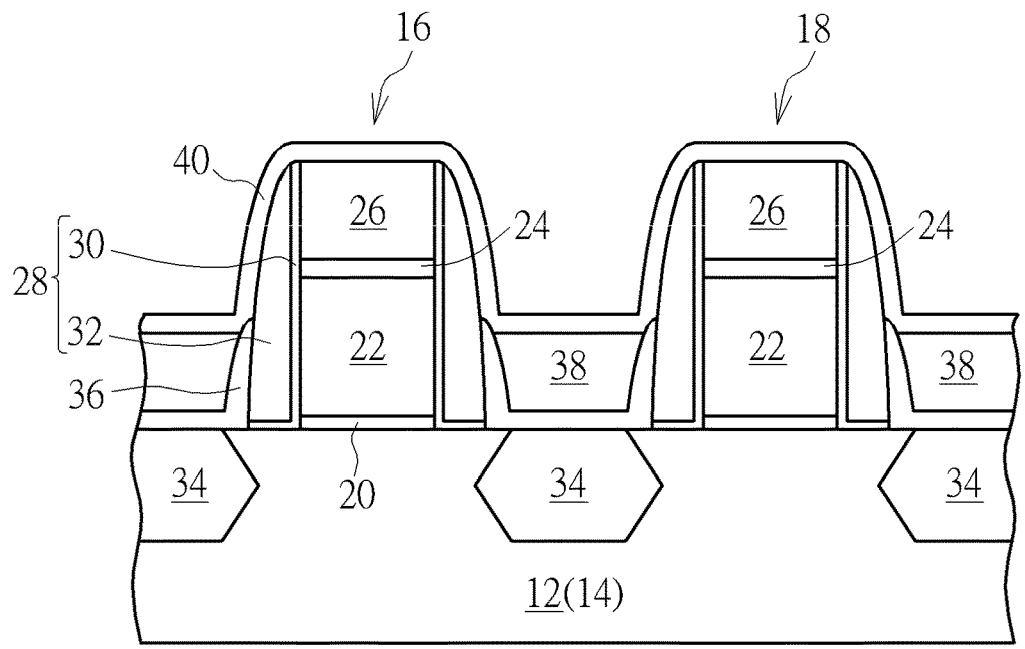

Next, as shown in FIG. 6, a second CESL 40 is formed on the mask layer 38 and the gate structures 16, 18. In this embodiment, the first CESL 36 and the second CESL 40 preferably include different material and/or different dielectric constant, and the dielectric constant of the first CESL 36 is specifically lower than the dielectric constant of the second CESL 40. In this embodiment, the first CESL 36 is preferably made of low-k SiOCN and the second CESL 40 is made of silicon nitride fabricated through higher radio-frequency (RF) power thereby having less hydrogen bond. Preferably, the dielectric constant of the first CESL 36 is between 4-5 and the dielectric constant of the second CESL 40 is between 7-8.

Figure 7:
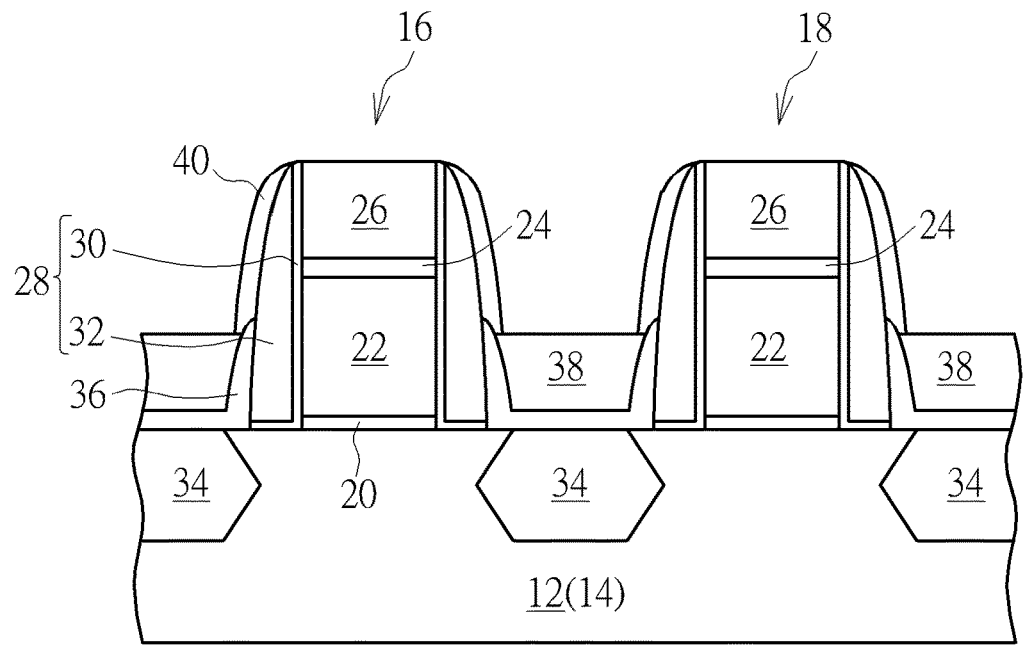

Next, as shown in FIG. 7, an etching process is conducted to remove part of the second CESL 40 so that the remaining second CESL 40 becomes slightly spacer shaped on the sidewall of the main spacer 32 while sitting on top of the first CESL 36. In this embodiment, the etching process used to remove part of the second CESL 40 could include gas such as but not limited to for example HBr, $CF_4$, or combination thereof.

Figure 8:
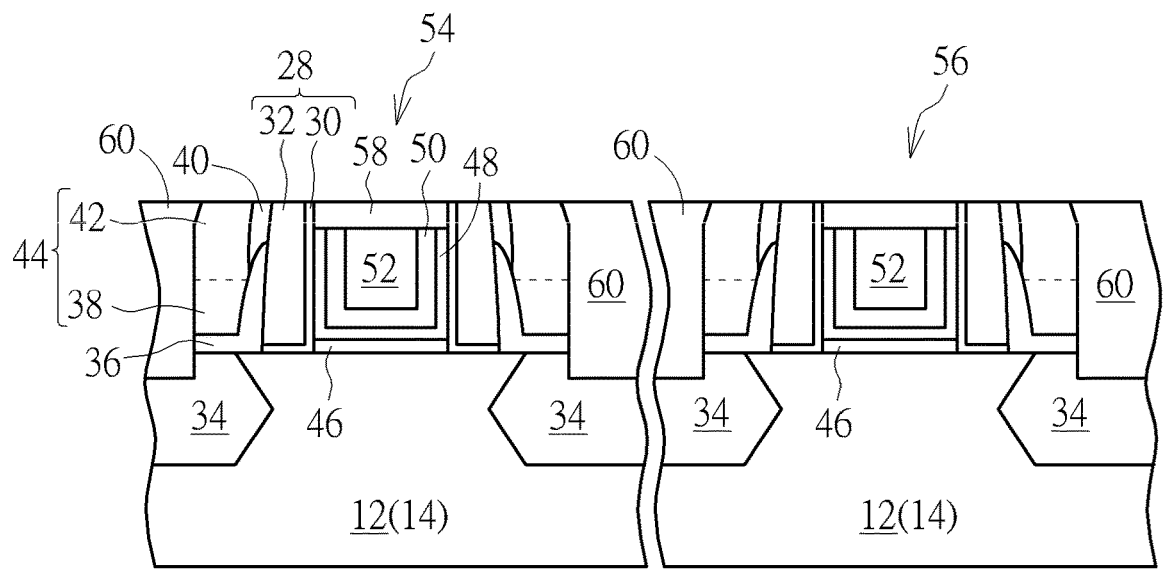

Next, as shown in FIG. 8, a replacement metal gate (RMG) process is conducted to transform the gate structures 16, 18 into metal gates. For instance, a dielectric layer 42 could be formed on the mask layer 38 to cover the gate structures 16, 18, and a planarizing process such as chemical mechanical polishing (CMP) process is conducted to remove part of the dielectric layer 42, the second hard mask 26, and the first hard mask 24 to expose the gate material layer 22 of each of the gate structures 16, 18 so that the top surfaces of the gate material layer 22 and the dielectric layer 42 are coplanar. In this embodiment, the dielectric layer 42 and the mask layer 38 could constitute an interlayer dielectric (ILD) layer 44 altogether, in which the dielectric layer 42 and the mask layer 38 could be made of same material such as silicon oxide or different material, which are all within the scope of the present invention.

Next, a selective dry etching or wet etching process is conducted by using etchants including but not limited to for example ammonium hydroxide ($NH_4OH$) or tetramethylammonium hydroxide (TMAH) to remove the gate material layer 22 and even gate dielectric layer 20 for forming a recess (not shown) in the ILD layer 44. Next, a gate dielectric layer or interfacial layer 46, a high-k dielectric layer 48, a work function metal layer 50, and a low resistance metal layer 52 are formed in the recess, and a planarizing process such as CMP is conducted to remove part of low resistance metal layer 52, part of work function metal layer 50, and part of high-k dielectric layer 48 to form metal gates 54, 56.

Next, part of the low resistance metal layer 52, part of the work function metal layer 50, and part of the high-k dielectric layer 48 are removed to form another recess (not shown), and a hard mask 58 made of dielectric material including but not limited to for example silicon nitride is deposited into each recess so that the top surfaces of the hard mask 58 and ILD layer 44 are coplanar. In this embodiment, each of the gate structure or metal gates 56, 58 fabricated through high-k last process of a gate last process preferably includes an interfacial layer 46 or gate dielectric layer, a U-shaped high-k dielectric layer 48, a U-shaped work function metal layer 50, and a low resistance metal layer 52.

In this embodiment, the high-k dielectric layer 48 is preferably selected from dielectric materials having dielectric constant (k value) larger than 4. For instance, the high-k dielectric layer 48 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 50 is formed for tuning the work function of the metal gate in accordance with the conductivity of the device. For an NMOS transistor, the work function metal layer 50 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 50 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 50 and the low resistance metal layer 52, in which the material of the barrier layer may include titanium (Ti), titanium nitride (TiN), tantalum (Ta) or tantalum nitride (TaN). Furthermore, the material of the low-resistance metal layer 52 may include copper (Cu), aluminum (Al), titanium aluminum (TiAl), cobalt tungsten phosphide (CoWP) or any combination thereof.

Next, a photo-etching process is conducted by using a patterned mask (not shown) as mask to remove part of the ILD layer 44 adjacent to the metal gates 54, 56 for forming contact holes (not shown) exposing the source/drain region 34 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 60 electrically connecting the source/drain region 34. This completes the fabrication of a semiconductor device according to a preferred embodiment of the present invention.

Referring again to FIG. 8, FIG. 8 further illustrates a structural view of a semiconductor device according to an embodiment of the present invention. As shown in FIG. 8, the semiconductor device includes a gate structure such as metal gate 54 on the fin-shaped structure 14, a hard mask 58 on the metal gate 54, a spacer 28 around the metal gate 54, a first CESL 36 around and contacting the spacer 28, a second CESL 40 around and contacting the spacer 28 and sitting on top of the first CESL 36, and a ILD layer 48 around the metal gate 54, in which the top surface of the ILD layer 44 is even with the top surfaces of the hard mask 58 and the second CESL 40.

Viewing from a more detailed perspective, the top surface of the first CESL 36 is slightly lower than the top surface of the metal gate 54, the first CESL 36 and the second CESL 40 are preferably made of different material and/or having different dielectric constant, and the dielectric constant of the first CESL 36 is preferably lower than the dielectric constant of the second CESL 40. In this embodiment, the first CESL 36 is preferably made of SiOCN while the second CESL 40 is made of silicon nitride fabricated through higher RF power thereby having less hydrogen bond. Preferably, the dielectric constant of the first CESL 36 is between 4-5 and the dielectric constant of the second CESL 40 is between 7-8.

It has been commonly observed that if a CESL made of low-k dielectric material were formed on the sidewalls of the gate structure during FinFET process problem such as RC delay could be improved. This however brings out another drawback such as the time-dependent dielectric breakdown (TDDB) issue. In order to resolve these two issues at the same time, the present invention specifically forms CESL made of two different material on the sidewalls of the gate structure or spacer, in which the first CESL on the lower level is preferably made of low-k material such as SiOCN while the second CESL on the higher level is made of material having higher dielectric constant such as SiN. By forming CESL made of materials having different dielectric constant on the corresponding lower sidewalls and upper sidewalls of the spacer, both issues including RC delay and TDDB could be resolved simultaneously.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:

forming a gate structure on a substrate;

forming a spacer around the gate structure;

forming a first contact etch stop layer (CESL) around the spacer and on and directly contacting the gate structure and the substrate;

forming a mask layer on the first CESL;

removing part of the mask layer;

removing part of the first CESL;

forming a second CESL on the mask layer and the gate structure, wherein the second CESL is around the spacer and on and directly contacting the spacer and the first CESL; and removing part of the second CESL.

* * * * *